United States Patent [19]
Barreto et al.

[11] Patent Number: 5,220,489
[45] Date of Patent: Jun. 15, 1993

[54] MULTICOMPONENT INTEGRATED CIRCUIT PACKAGE

[75] Inventors: Joaquin Barreto, Sunrise; Juan O. Alfonso, Fort Lauderdale; Frank J. Juskey, Coral Springs, all of Fla.

[73] Assignee: Motorola, Inc., Schaumburg, Ill.

[21] Appl. No.: 774,921

[22] Filed: Oct. 11, 1991

[51] Int. Cl.$^5$ .............................................. H05K 7/02
[52] U.S. Cl. ................................... 361/400; 361/393; 361/396; 361/421; 174/52.2; 174/260
[58] Field of Search ............... 361/393, 396, 398, 400, 361/402, 421; 174/52.2, 255, 260; 357/72, 75

[56] References Cited

U.S. PATENT DOCUMENTS

| | | | |
|---|---|---|---|
| 4,521,828 | 6/1985 | Fanning | 361/386 |
| 4,604,168 | 8/1986 | Liu et al. | 204/30 |
| 5,018,005 | 5/1991 | Lin et al. | 357/80 |
| 5,045,914 | 9/1991 | Casto et al. | 357/70 |
| 5,136,366 | 8/1992 | Worp et al. | 357/72 |
| 5,153,379 | 10/1992 | Guzuk et al. | 174/35 R |
| 5,153,385 | 10/1992 | Juskey et al. | 174/260 |

Primary Examiner—Leo P. Picard
Assistant Examiner—Young S. Whang
Attorney, Agent, or Firm—Dale W. Dorinski

[57] ABSTRACT

An electronic package, comprising a circuit carrying substrate (30) and a semiconductor device (35). The substrate (30) has two opposing surfaces, the first or bottom surface having a plurality of solder pads (31) and the second or top surface having a circuitry pattern defined on it. A semiconductor device (35) is attached to the top surface of the circuit carrying substrate (30). A molded body (33) is formed completely around the semiconductor device (35) in order to encapsulate it, the molded body also substantially covering the top surface of the circuit carrying substrate (30). A layer of metal deposited directly on the molded body and the top surface of the circuit carrying substrate is delineated into another conductive circuitry pattern (38), with part of the pattern (36) connected to the circuitry pattern on the circuit carrying substrate. An electronic component (32) is mounted on the molded body (33) and electrically connected to the conductive circuitry pattern (38).

15 Claims, 5 Drawing Sheets 5,220,489

MULTICOMPONENT INTEGRATED CIRCUIT PACKAGE

TECHNICAL FIELD

This invention relates generally to semiconductor device packages, and more particularly to transfer molded semiconductor device packages having a discrete component mounted on the outside of the package.

BACKGROUND

It is well known in the field of microelectronics that high frequency operation, particularly switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and the ground leads of the integrated circuit. Conventional methods of decoupling include the use of decoupling capacitors external to the IC package, such as monolithic, multilayer ceramic chip capacitors. One external connection scheme of this type, which is found to be quite successful, is to mount a decoupling capacitor on the printed circuit board outside the integrated circuit. Plated-through holes in the circuit board are used to connect the capacitor to the power and ground which, in turn, makes contact with the appropriate leads of the integrated circuit. Other external connection schemes mount a decoupling capacitor either underneath the integrated circuit package or internal to the integrated circuit package. Such decoupling capacitors are commercially available from Rodgers Corporation and examples of these may be found in U.S. Pat. Nos. 4,994,936, 4,754,366 and 4,475,143.

The above decoupling techniques suffer from several deficiencies. The most serious of these resides in the fact that circuits, including the capacitors, become highly inductive at high frequencies as a consequence of the shape and length of the leads and interconnection traces between the discrete capacitor and the integrated circuit which it decouples. In high-frequency circuitry, this inductance may be sufficiently high to nullify the high-frequency effect attained by the circuit. A second deficiency is the spatial inefficiency found when employing a capacitor adjacent to an integrated circuit. The space requirements of a discrete decoupling capacitor and the required interconnection traces on a printed circuit board adversely affect the optimum component packaging density which might be achieved. Capacitors that are mounted internal to the molded integrated circuit package overcome the inductance problem but are difficult and expensive to manufacture. The steps of mounting the capacitor to the lead frame must be performed prior to encapsulation and are subject to yield issues in the manufacturing environment. Conventional methods of adding a discrete component external to the package, such as on top of or underneath the integrated circuit package, result in an inefficient package because of the cumbersome schemes utilized to connect the pins of the integrated circuit to the capacitor leads. Such methods rely upon separate metal foils or wires and are bulky and non-reproducible.

Accordingly, there continues to be a need for improved connection schemes for decoupling high-frequency noise from integrated circuits wherein the inductance within a decoupling loop is reduced to as low a level as possible.

SUMMARY OF THE INVENTION

Briefly, according to the invention, there is provided an electronic package, comprising a circuit carrying substrate and a semiconductor device. The substrate has two opposing surfaces, the first or bottom surface having a plurality of solder pads and the second or top surface having a circuitry pattern defined on it. The semiconductor device is attached to the top surface of the circuit carrying substrate. A molded body is formed completely around the semiconductor device in order to encapsulate it, the molded body also substantially covers the top surface of the circuit carrying substrate. A layer of metal deposited directly on the molded body is delineated into another conductive circuitry pattern, with part of the pattern connected to at least one of the plurality of solder pads. An electronic component is mounted on the molded body and electrically connected to the conductive circuitry pattern.

In a further embodiment, the electronic component is a capacitor. Still another embodiment outlines a method of manufacturing a molded semiconductor package that has an electronic component mounted thereon.

DETAILED DESCRIPTION OF THE PREFERRED EMBODIMENT

Figure 1:
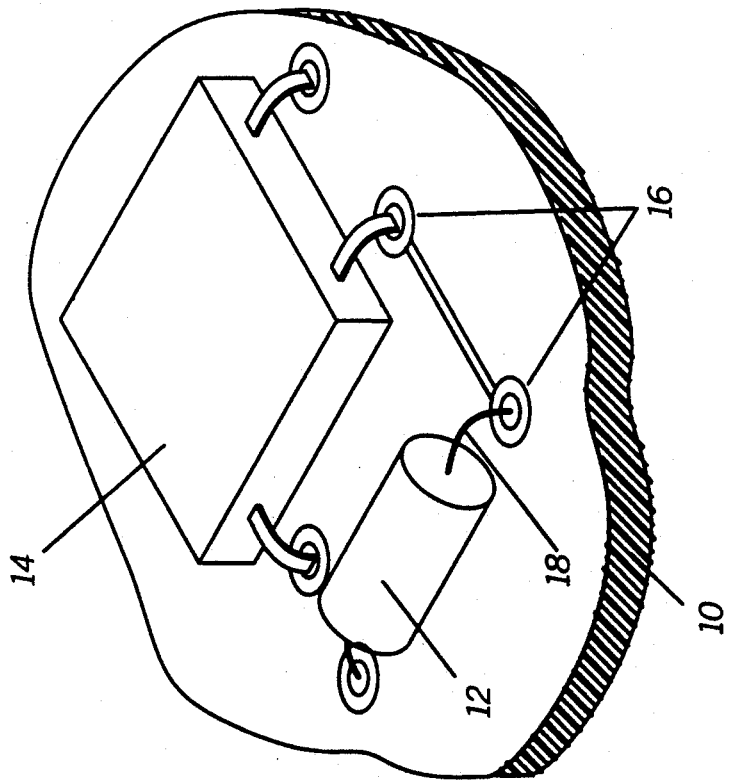
FIG. 1 is an isometric view of an integrated circuit package having an external decoupling capacitor mounted on a printed circuit board in accordance with the prior art.
Figure 2:
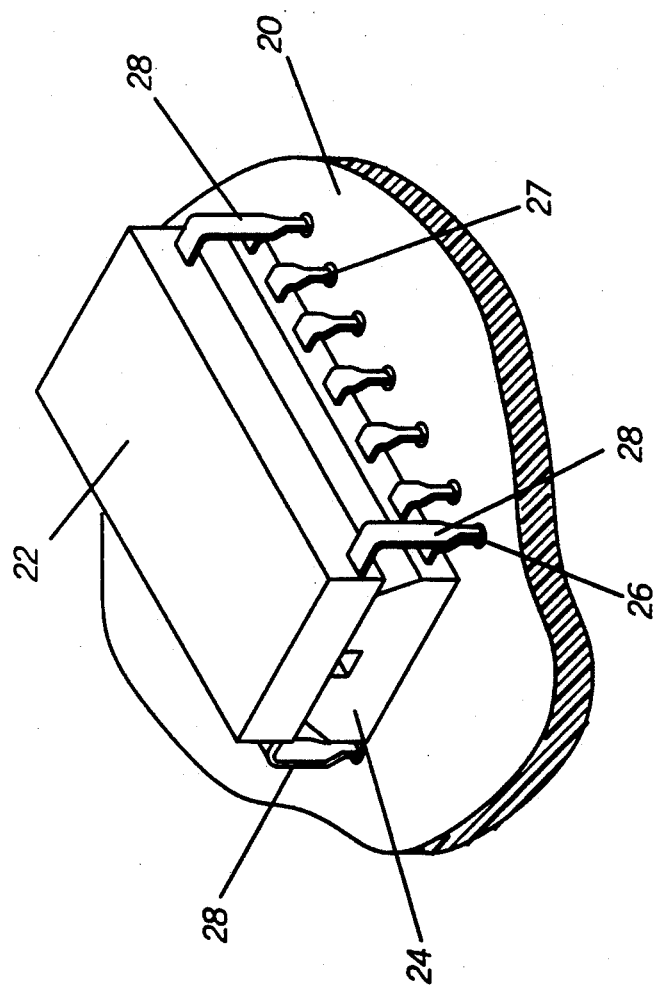
FIG. 2 is an isometric view of a decoupling capacitor mounted piggyback to a semiconductor device package in accordance with the prior art.

Referring first to prior art FIG. 1, a multilayer printed circuit board 10 is shown having a capacitor 12 and a molded integrated circuit package 14 mounted thereon. Capacitor 12 is mounted outside the package 14 and connected to plated-through holes 16 in printed circuit board 10. The plated-through holes are used to connect the capacitor leads 18 to the power and ground leads of the molded integrated circuit package 14. Prior art FIG. 2 shows another mounting scheme wherein a decoupling capacitor 22 is connected to a molded dual in-line package 24 by incorporating the leads 28 of the capacitor into the same plated-through holes 26 used by the power and ground leads 27 of the molded integrated circuit 24. The entire assembly is mounted to circuit board 20.

As discussed earlier, the prior art schemes of FIGS. 1 and 2 both suffer from serious deficiencies and drawbacks, including high inductance in the leads and printed circuit board traces as well as inefficient use of circuit board real estate, which adversely affects component packaging density in the final product.

Figure 3:
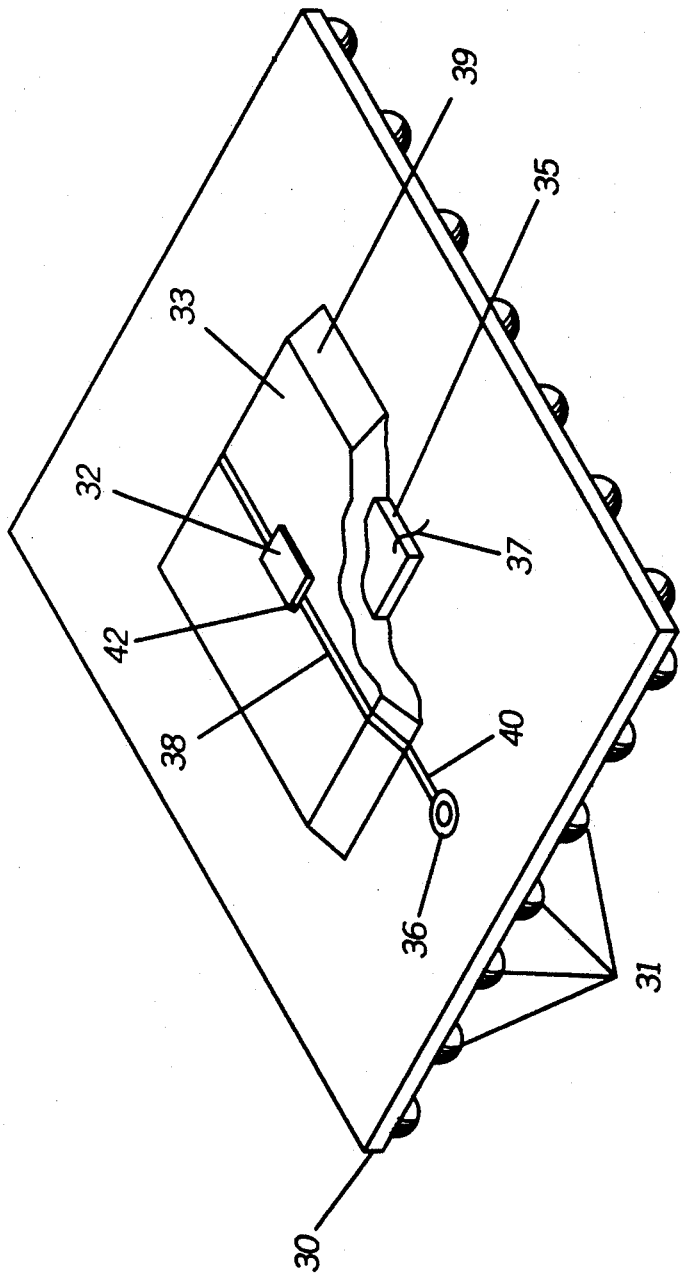
FIG. 3 is a partially cut-away isometric view of a molded integrated circuit package having an electronic component attached, in accordance with the invention.

These important problems are overcome by the scheme of the present invention which is specifically applicable to use with overmolded or transfer molded pad grid or pin grid array packages. Pad grid array or pin grid array packages, such as shown in FIG. 3, are known to those skilled in the art and comprise a square or rectangular base portion 30 having on the bottom surface a plurality of pins or solderable surfaces or pads 31 in an array or pattern extending therefrom. In the case of an overmolded or transfer-molded chip carrier, the base 30 is a printed circuit board material such as glass, reinforced epoxy or polyimide, but may also be made from alternative materials such as ceramics or flexible polyimide film. Generally, the pins or pads 31 are located about the inner periphery of the base portion 30 and typically occupy the center area of the base portion 30, thereby obviating mounting of any other components in this area. It is well known that pin or pad configurations and overall sizings of grid array packages may differ significantly from one type of part to the next depending upon particular electronic requirements. It will be appreciated then that while a pad grid array package having an array of pads 31 is shown in FIG. 3, other pad grid array packages may have greater or fewer numbers of pads in the array or may contain pins in place of the pads. The pad grid array package of FIG. 3 may be mounted by soldering either directly to a printed circuit board (not shown) or may be preliminarily mounted in a socket prior to mounting on a circuit board. The pad grid array package also contains an integrated circuit (IC) 35 mounted on the substrate or base substrate 30. The integrated circuit 35 may be mounted by a number of means, but preferably by securing the IC to the base 30 by means of a conductive adhesive such as epoxy. Electrical interconnection between the various pads of the integrated circuit 35 and the base 30 is made by means of wirebonds 37. Connection of the integrated circuit device 35 to the base 30 may also be made by mounting the integrated circuit face down onto the base 30 and making electrical interconnections by means of solder bumps, TAB, or other known technologies. The assembly, now containing base 30 and integrated circuit 35, is then transfer molded or encapsulated by placing the assembly into a molding machine. A plastic molding compound 33 is then transfer molded around the integrated circuit 35 and associated wirebonds 37 or electrical interconnections in order to completely encapsulate the integrated circuit 35 and associated electrical interconnections. Upon removal from the molding machine, the plastic molding compound 33 hardens to form a body around the integrated circuit 35. It should be noted that walls 39 of the body 33 are not perpendicular to the base 30 but are preferably sloped at an oblique angle.

A layer of conductive metal is then applied over the exposed surfaces of the body 33 and the surface of the substrate 30. Numerous techniques may be employed to apply the layer of metal, such as electroless plating, vacuum evaporation, vacuum sputtering, etc. The particular technique chosen will be a function of the materials used in the construction of the integrated circuit package and the expertise and equipment available to the individual manufacturer. In the preferred embodiment, vacuum sputtering is utilized in order to provide optimum adhesion between the metal layer 40 and the plastic body 33. Sputtering techniques for forming a layer of metal directly on a substrate are well known to those skilled in the art and may be found, for example, in U.S. Pat. No. 4,604,168. The metal layer 40 is then delineated into a circuitry pattern 38, an example of which is shown in FIG. 3. The circuitry is connected to at least one interconnection 36 which is connected either directly or indirectly to at least one of the plurality of solderable surfaces or pads 31 on the underside of body 30. The conductive trace 38 is extended from the upper surface of the body 33 down walls 39 of the body and onto the top surface of the substrate 30.

After formation of the circuitry 38, a discrete component 32, for example, a decoupling capacitor, is affixed to the circuitry 38. Connection to the circuitry is typically made by means of a solder joint 42 but may also be made by means of conductive epoxies, wirebonds, or other suitable alternatives. In the preferred embodiment, electrical component 32 is a leadless, multilayer ceramic capacitor used for decoupling the integrated circuit. However, numerous other components such as a resistor, an inductor, transistor, crystal, etc., may be utilized in place of the decoupling capacitor for other intended purposes.

Figure 4:
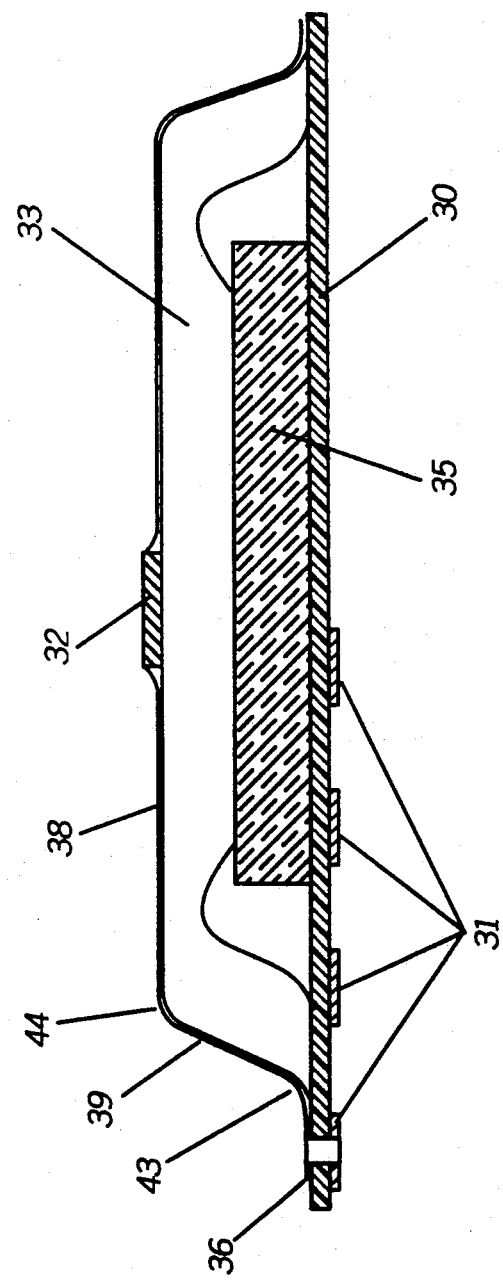
FIG. 4 is a cross-sectional, elevational view of FIG. 3.

Referring now to FIG. 4, a cross-sectional view of the transfer-molded chip carrier shown in FIG. 3, it may be seen that walls 39 of body 33 are not only sloped but are radiused at interior and exterior portions 43 and 44. The reason for sloping and radiusing walls 39 is to permit more reliable interconnection of the circuitry 38 that connects the electrical component 32 with plated-through hole interconnection 36. Note that plated-through hole 36 is connected to one of the plurality of the pads 31, thereby achieving connection between the component 32 and the circuit traces of the printed circuit board 30, and also connection to integrated circuit 35 since each of the pads 31 is ultimately connected to the IC 35.

Figure 5:
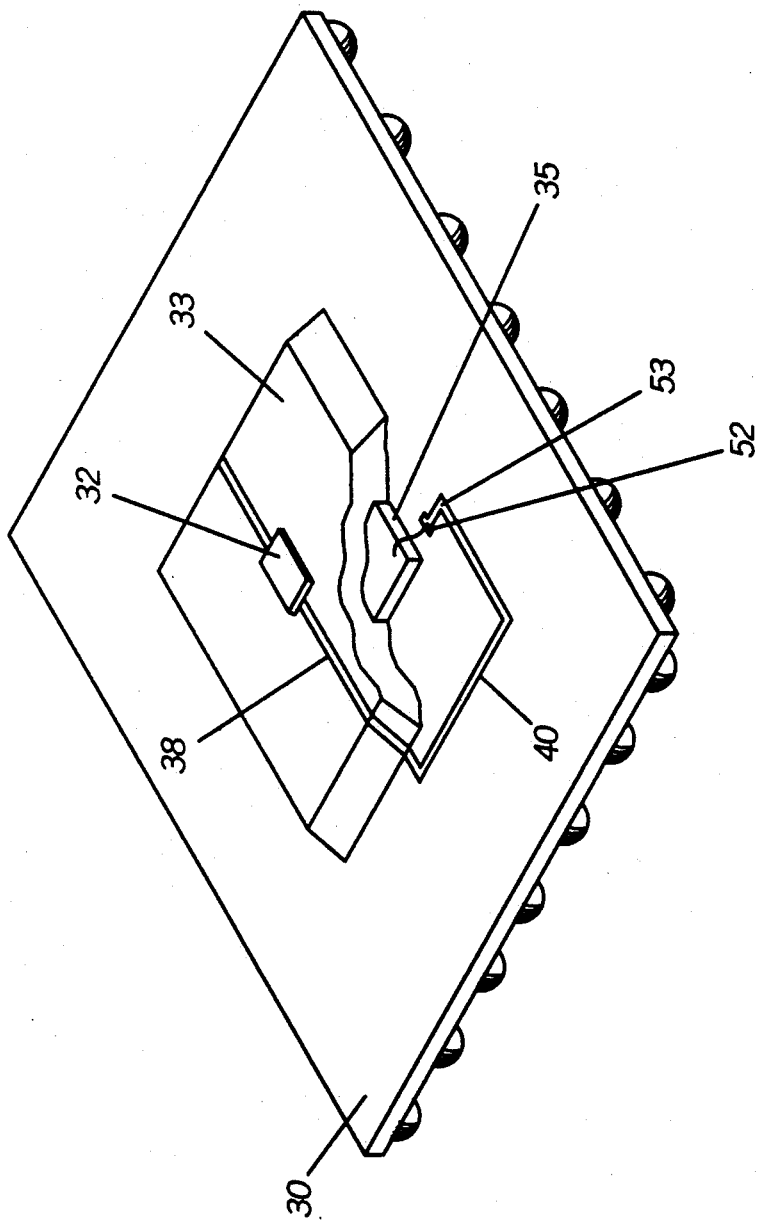
FIG. 5 is an alternate embodiment of a chip carrier package in accordance with the invention.

Referring now to FIG. 5, an alternate embodiment of the invention is shown wherein the circuitry pattern 38 formed from the metal layer 40 is electrically interconnected directly to the semiconductor device 35. The circuitry pattern 38 is connected to at least one of the wirebond pads 52 by defining the circuitry pattern 38 so as to interconnect with an exposed portion 53 of the wirebond pad 52 that extends beyond the body 33. This direct interconnection provides an even shorter path between the component 32 and the IC 35, thereby further reducing the high frequency noise within the circuit.

A chip carrier made in accordance with the present invention permits a reduction in the amount of circuit board real estate occupied by the prior art decoupling devices as shown in prior art FIG. 1. It also eliminates the need for leaded pins to interconnect the decoupling capacitor to the circuit as shown in prior art FIG. 2. Thus, a much more effective decoupling scheme providing a greater amount of usable real estate on a circuit board and a smaller finished package is achieved. While a preferred embodiment has been shown and described, various modifications and substitutions may be made thereto without departing from the spirit and scope of the invention. For example, a leaded capacitor may be used in place of a leadless capacitor, the leads extending in such a way as to be soldered directly to the metallization. The electronic compound may also be mounted directly on the sloped or vertical wall 39 of the body 33 as opposed to the top surface. Or the electrical component may be a component other than a decoupling capacitor, for example, a resistor, inductor, crystal or transistor. Accordingly, it is to be understood that the present invention has been described by way of illustrations and not limitations and is to be limited only by the appended claims herein.

What is claimed is:

1. An electronic package, comprising:
   a circuit substrate having opposing first and second surfaces, said first surface having a plurality of solderable interconnections and said second surface having a first circuitry pattern;
   a semiconductor device mechanically mounted on the second surface of the circuit substrate and electrically connected to the first circuitry pattern;
   a molded body completely encapsulating the semiconductor device and substantially covering the first surface of the circuit substrate;
   a layer of metal deposited directly on the molded body, said layer formed into a second conductive circuitry pattern connected to at least the first conductive circuitry pattern; and
   at least one electronic component mounted on the molded body and electrically connected to the second conductive circuitry pattern.

2. The electronic package of claim 1, wherein the molded body is smaller than the circuit substrate, thereby exposing a portion of the second surface of the circuit substrate.

3. The electronic package of claim 1, wherein the circuit substrate is glass-reinforced printed circuit board material.

4. The electronic package of claim 1, wherein the circuit substrate is flexible film printed circuit material.

5. The electronic package of claim 4, wherein the flexible film printed circuit material is selected from the group consisting of polyimide, polyester, and polyetherimide.

6. The electronic package of claim 1, wherein the electronic component is a leadless component.

7. The electronic package of claim 1, wherein the leadless component is a capacitor.

8. The electronic package of claim 1, wherein the walls of the molded body are formed at an oblique angle with reference to the circuit substrate.

9. A method of manufacturing an electronic package, comprising the steps of:
   providing a circuit carrying substrate and a semiconductor device, said semiconductor device being electrically and mechanically attached to a first surface of said circuit carrying substrate, and said circuit carrying substrate having an array of solderable interconnections on a second surface;
   molding a body which completely encapsulates the semiconductor device and substantially covers the first surface of the circuit carrying substrate;
   depositing a layer of metal directly on the molded body and the first surface of the circuit carrying substrate, said layer of metal being electrically interconnected to the first circuitry pattern and to the semiconductor device;
   defining a second circuitry pattern in the layer of metal;
   attaching an electronic component to the molded body; and
   electrically connecting the electronic component to the second circuitry pattern.

10. The method of manufacturing the electronic package of claim 9, wherein the step of molding a body comprises transfer molding a body so as to reveal a portion of the first surface of the circuit carrying substrate about a perimeter of the body.

11. The method as described in claim 9, wherein the step of depositing a layer of metal comprises depositing the layer of metal by vacuum deposition.

12. The method as described in claim 9, wherein the step of electrically connecting comprises soldering the electronic component to the second circuitry pattern.

13. A pad array chip carrier package, comprising:
   a printed circuit board having opposing first and second surfaces, the first surface having a metallization pattern with a portion of the pattern providing a mounting area for a semiconductor device, the second surface having a plurality of solder pads disposed thereon;
   a semiconductor device disposed on said mounting area and electrically connected to the printed circuit board metallization pattern by wire bonds;
   a thermosetting resin body transfer molded to completely encapsulate the semiconductor device and the wire bonds, and substantially covering the first surface of the printed circuit board;
   a layer of metal deposited directly on the thermosetting resin body and portions of the first surface of the printed circuit board, said layer formed into a conductive circuitry pattern electrically connected to the printed circuit board metallization pattern; and
   a capacitor mounted on the thermosetting resin body and electrically connected to the conductive circuitry pattern.

14. The pad array chip carrier package of claim 13, wherein the thermosetting resin body is smaller than the printed circuit board, thereby revealing a portion of the first surface of the printed circuit board about a perimeter of the thermosetting resin body.

15. The pad array chip carrier of claim 13, wherein the capacitor mounted in the thermal setting resin body is a crystal.

* * * * *